United States Patent
Farnworth et al.

(10) Patent No.: US 7,064,010 B2
(45) Date of Patent: Jun. 20, 2006

(54) METHODS OF COATING AND SINGULATING WAFERS

(75) Inventors: Warren M. Farnworth, Nampa, ID (US); Kyle K. Kirby, Boise, ID (US); William M. Hiatt, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 168 days.

(21) Appl. No.: 10/690,417

(22) Filed: Oct. 20, 2003

(65) Prior Publication Data

US 2005/0082651 A1  Apr. 21, 2005

(51) Int. Cl.
  *H01L 21/463* (2006.01)
  *H01L 21/465* (2006.01)
  *H01L 21/82* (2006.01)

(52) U.S. Cl. ............. 438/114; 438/462; 438/465; 438/667

(58) Field of Classification Search ............ 438/113, 438/114, 458, 460, 461, 462, 463, 464, 465, 438/666, 667, 668, 672, 675
See application file for complete search history.

(56) References Cited

U.S. PATENT DOCUMENTS

| | | | |
|---|---|---|---|
| 3,978,578 A | 9/1976 | Murphy | |
| 4,033,027 A | 7/1977 | Fair et al. | |
| 5,157,001 A | 10/1992 | Sakuma | |
| 5,462,636 A | 10/1995 | Chen et al. | |
| 5,682,065 A | 10/1997 | Farnworth et al. | |
| 5,742,094 A | 4/1998 | Ting | |
| 5,933,713 A | 8/1999 | Farnworth | |
| 5,956,605 A | 9/1999 | Akram et al. | |
| 5,977,641 A * | 11/1999 | Takahashi et al. | .......... 257/778 |
| 6,210,993 B1 | 4/2001 | Farnworth et al. | |
| 6,251,488 B1 | 6/2001 | Miller et al. | |
| 6,259,962 B1 | 7/2001 | Gothait | |
| 6,268,584 B1 | 7/2001 | Keicher et al. | |
| 6,326,698 B1 | 12/2001 | Akram | |
| 6,337,122 B1 | 1/2002 | Grigg et al. | |
| 6,353,267 B1 * | 3/2002 | Ohuchi et al. | .............. 257/787 |

(Continued)

OTHER PUBLICATIONS

Miller et al., "Maskless Mesoscale Materials Deposition", Deposition Technology, Sep. 2001, pp. 20-22.

(Continued)

*Primary Examiner*—Zandra V. Smith
*Assistant Examiner*—Pamela E Perkins
(74) *Attorney, Agent, or Firm*—TraskBritt (57) ABSTRACT

Separating and coating semiconductor dice at the wafer level to form individual chip-scale packages. In one embodiment, channels are formed in the active surface of a wafer to expose side surfaces of semiconductor dice. The surfaces of the channels are then etched to remove defects resulting from cutting. A first protective coating is deposited to seal the wafer active surface and the exposed side surfaces of each semiconductor die. Finally, the wafer is singulated along the channels to provide a plurality of individual chip-scale packages. Alternatively, material is removed from the back side of the wafer to expose the channels, and a second protective coating is applied to provide completely sealed chip-scale packages. Portions of the first protective coating may also be formed to project from the channels to anchor the second protective coating in place. In another embodiment, the first protective coating is formed without forming channels in the active surface of the wafer, and then channels are formed in the back side of the wafer.

50 Claims, 9 Drawing Sheets

U.S. PATENT DOCUMENTS

| | | | |
|---|---|---|---|
| 6,391,251 B1 | | 5/2002 | Keicher et al. |
| 6,399,178 B1 | * | 6/2002 | Chung .................. 428/131 |
| 6,432,752 B1 | | 8/2002 | Farnworth |
| 6,482,576 B1 | | 11/2002 | Farnworth et al. |
| 6,489,007 B1 | | 12/2002 | Grigg et al. |
| 6,514,798 B1 | | 2/2003 | Farnworth |
| 6,524,346 B1 | | 2/2003 | Farnworth |
| 6,544,821 B1 | | 4/2003 | Akram |
| 6,544,902 B1 | | 4/2003 | Farnworth |
| 6,549,821 B1 | | 4/2003 | Farnworth et al. |
| 6,562,278 B1 | | 5/2003 | Farnworth et al. |
| 6,562,647 B1 | * | 5/2003 | Zandman et al. ........... 438/33 |
| 6,585,927 B1 | | 7/2003 | Grigg et al. |
| 6,593,171 B1 | | 7/2003 | Farnworth |
| 6,620,731 B1 | * | 9/2003 | Farnworth et al. ......... 438/667 |
| 6,635,333 B1 | | 10/2003 | Grigg et al. |
| 6,849,524 B1 | * | 2/2005 | Shelton et al. ............ 438/465 |
| 6,885,108 B1 | * | 4/2005 | Luo et al. .................. 257/778 |
| 2002/0066966 A1 | | 6/2002 | Farnworth |
| 2002/0098623 A1 | | 7/2002 | Akram |
| 2002/0171177 A1 | | 11/2002 | Kritchman et al. |
| 2002/0182782 A1 | | 12/2002 | Farnworth |
| 2003/0003180 A1 | | 1/2003 | Farnworth et al. |
| 2003/0003380 A1 | | 1/2003 | Farnworth et al. |
| 2003/0003405 A1 | | 1/2003 | Farnworth et al. |
| 2003/0043360 A1 | | 3/2003 | Farnworth |
| 2003/0068584 A1 | | 4/2003 | Farnworth et al. |
| 2003/0072926 A1 | | 4/2003 | Grigg et al. |
| 2003/0077418 A1 | | 4/2003 | Grigg et al. |
| 2003/0089999 A1 | | 5/2003 | Akram |
| 2003/0092220 A1 | | 5/2003 | Akram |
| 2003/0093173 A1 | | 5/2003 | Farnworth et al. |
| 2003/0102566 A1 | | 6/2003 | Farnworth |
| 2003/0129787 A1 | | 7/2003 | Farnworth |
| 2003/0151167 A1 | | 8/2003 | Kritchman et al. |
| 2003/0201531 A1 | | 10/2003 | Farnworth et al. |
| 2003/0203158 A1 | | 10/2003 | Farnworth et al. |
| 2003/0207213 A1 | | 11/2003 | Farnworth |

OTHER PUBLICATIONS

Miller, "New Laser-Directed Deposition Technology", Microelectronic Fabrication, Aug. 2001, p. 16.

Webpage, Objet Prototyping the Future, Objet FullCure700 Series, 1 page.

Webpage, Objet Prototyping the Future, How it Works, 2 pages.

U.S. Appl. No. 09/589,841, filed Jun. 8, 2000, entitled "Stereolithographic Methods for Forming a Protective Layer on a Semiconductor Device Substrate and Substrates Including Protective Layers So Formed", inventor Farnworth et al.

U.S. Appl. No. 09/651,930, filed Aug. 31, 2000, entitled "Semiconductor Device Including Leads in Communication with Contact Pads Thereof and a Stereolithgraphically Fabricated Package Substantially Encapsulating the Leads and Methods for Fabricating the Same", inventor Salman Akram.

U.S. Appl. No. 10/370,755, filed Feb. 20, 2003, entitled "Chip Scale Package Structures and Method of Forming Conductive Bumps Thereon", inventor Warren M. Farnworth.

U.S. Appl. No. 10/608,749, filed Jun. 26, 2003, entitled "Methods for Labeling Semiconductor Device Components", inventor Grigg et al.

U.S. Appl. No. 10/619,918, filed Jul. 15, 2003, entitled "Stereolithographic Methods for Fabricating Hermetic Semiconductor Device Packages and Semiconductor Devices Including Stereolithographically Fabricated Hermetic Packages", inventor Warren M. Farnworth.

U.S. Appl. No. 10/672,098, filed Sep. 26, 2003, entitled "Apparatus and Methods for Use in Stereolithographic Processing of Components and Assemblies", inventor Warren M. Farnworth.

\* cited by examiner

METHODS OF COATING AND SINGULATING WAFERS

BACKGROUND OF THE INVENTION

1. Field of the Invention

The present invention relates to packaging of semiconductor dice. More particularly, the present invention relates to improved processes for separating and coating semiconductor dice at the wafer level to form individual chip-scale packages.

2. State of the Art

A solid-state electronic device in the form of a semiconductor die or chip is typically manufactured of materials such as silicon, germanium, gallium arsenide or indium phosphide. Circuitry is formed on an active surface of the semiconductor die and may include further circuit levels within the die itself. Bond pads are also formed on the active surface to provide electrical contacts for the semiconductor die circuitry. Due to the materials used and the intricate nature of construction, a semiconductor die is highly susceptible to physical damage or contamination from environmental conditions such as moisture.

Conventionally, a semiconductor die has been protected by mounting it within a plastic, metal or ceramic package that prevents physical contact with the die and provides hermetic sealing. The package also includes conductive leads for attaching the die bond pads to outside electrical connections. The materials required for this packaging approach increase cost, while resulting in a larger device size that takes up valuable real estate when mounted to a carrier substrate. The added lead structure may also influence processing speed, and further presents opportunities for moisture incursion at interfaces between the conductive leads and other packaging materials.

Some efforts to reduce the size and cost of these electronic devices have resulted in doing away entirely with the above-described packaging materials. Instead, the semiconductor die is protected by forming what is commonly referred to as a chip-scale package (CSP). In a typical example of this packaging method, a protective coating is added to surfaces of the semiconductor die itself, and conductive bumps are formed over the die bond pads using a variety of known techniques such as screen printing or by ball bumping with wire-bonding equipment. The bumps may then be electrically connected to circuitry on a carrier substrate by tape automated bonding (TAB), or may be directly attached thereto by mounting the semiconductor die in a flip-chip fashion on the carrier substrate. Alternatively, the conductive bumps may be omitted, and the CSP may be attached to a carrier substrate using conventional wire bonds.

Materials used for formation of the protective coating on the surfaces of the semiconductor die may include, for example, silicon nitride (SiN), silicon dioxide ($SiO_2$), or other materials like epoxy or polymers. In the prior art, these coatings would be deposited on the active and passive surfaces of a wafer containing an array of semiconductor die locations, and the wafer would subsequently be singulated to provide individual semiconductor dice. A resulting semiconductor die using this method suffers from the fact that its sides, and specifically the sides of its active surface, are left exposed after the wafer singulation. The possibility remains, therefore, that moisture may enter the sides of the die and damage nearby circuitry.

In order to rectify these shortcomings, various attempts have been made to add additional protective coatings to the sides of a semiconductor die. One approach to coating side surfaces has been to first form cuts or channels in the active surface of a wafer to at least partially expose the sides of each semiconductor die, and then deposit the protective coating onto the wafer. In this manner, the protective coating material enters the channels surrounding each die, and subsequent singulation of the wafer along the channels provides semiconductor dice having active surface and partial side surface coatings. Examples of such a process are disclosed in U.S. Pat. No. 5,742,094 to Ting, U.S. Pat. No. 5,933,713 to Farnworth and U.S. Pat. No. 5,956,605 to Akram et al. While these methods provide at least partial side surface protective coatings, they may require additional processing of the semiconductor dice on an individual basis to completely coat the sides or back of the semiconductor dice.

Another problem with these methods is that formation of the channels in the active surface of the wafer is typically accomplished using processes that may cause damage to the semiconductor material on the side surfaces of a completed semiconductor die. The channels may be formed, for instance, by cutting with a dicing saw or a laser. When the channels are cut using a dicing saw, diamond particles in the saw may leave nicks and scratches in the cutting surface. Similarly, when the channels are formed by laser cutting, heat from the laser energy may negatively affect the semiconductor material along the channel surfaces, leaving what is sometimes referred to as a heat-affected zone (HAZ). These material defects may result in crack propagation from stress concentrations that will damage the active circuitry adjacent to the channels, or may degrade the semiconductor material to a point where it exhibits current leakages or other undesirable electrical properties. This problem is further aggravated by the fact that the area available for cutting between adjacent semiconductor dice in a wafer, sometimes referred to as a street, is constantly being decreased to save space. For example, while wafers have previously typically been formed with 150-micron street widths, the current manufacturing technology involves forming narrower streets on the order of 100 microns. The reduction in width means that any material defects in the surfaces of channels will be closer to the active circuitry of a semiconductor die and will, therefore, be more likely to cause damage.

In view of the above, it would be desirable to have an improved method for separating and coating the surfaces of semiconductor dice at the wafer level.

BRIEF SUMMARY OF THE INVENTION

The present invention, in several embodiments, relates to improved chip-scale packages formed by methods that enable applications of protective coatings to multiple surfaces of semiconductor dice while remaining in a wafer level array. The methods also provide semiconductor die side surfaces that are free of the material defects associated with prior art chip-scale package formation.

In a first embodiment according to the present invention, channels are formed in the active surface of a wafer to expose side surfaces of an array of semiconductor dice contained in the wafer. The channels are initially formed along streets between adjacent semiconductor die locations by cutting with a dicing saw or a laser to a depth extending below the active circuitry of the wafer. The surfaces of the channels are then etched to remove defects in the semiconductor material resulting from cutting with the dicing saw or laser. Once the channels are completed, a protective coating is deposited on the active surface of the wafer to seal the active surface and at least a portion of the side surfaces of each semiconductor die. Finally, the wafer is singulated along the channels to provide a plurality of individual chip-scale packages having protective coatings covering the semiconductor die active surface and at least a portion of the side surfaces.

In a variation of the above embodiment, after depositing the protective coating on the active surface of the wafer, material is removed from the back surface of the wafer by a backgrinding or other planarization process to a depth that exposes the channels. A second protective coating is deposited on the back surface of the wafer, and the wafer is singulated along the channels to provide chip-scale packages having protective coatings covering the semiconductor die active surface, all of the side surfaces and the semiconductor die back surface.

In a further variation, after exposing the channels by backgrinding or planarization, the back surface of the wafer is etched to a depth such that a portion of protective coating material in the channels protrudes from the back surface of the wafer. When the second protective coating is deposited, the protruding coating material assists in anchoring the second protective coating in place.

In a second embodiment according to the present invention, the protective coating is deposited on the active surface of the wafer without forming channels in the active surface. Instead, channels are formed in the back surface of the wafer after depositing the protective coating on the active surface of the wafer. As with the first embodiment, the channels are initially formed along streets between adjacent semiconductor die locations by cutting with a dicing saw or a laser. The surfaces of the channels are then etched to remove defects in the semiconductor material resulting from cutting with the dicing saw or laser and to expose the protective coating formed on the wafer active surface through the channels. Once the channels are completed, a second protective coating is deposited onto the back surface of the wafer and over the protective coating in the channels, and the wafer is singulated along the channels to provide chip-scale packages having protective coatings covering the semiconductor die active surface, all of the side surfaces and the semiconductor die back surface.

Other and further features and advantages of the present invention will be apparent from the following descriptions of the various embodiments when read in conjunction with the accompanying drawings. It will be understood by one of ordinary skill in the art that the following embodiments are provided for illustrative and exemplary purposes only, and that numerous combinations of the elements of the various embodiments of the present invention are possible.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The following embodiments of the present invention are provided as examples to assist in a thorough understanding of the present invention. It should be apparent, however, that various additions, modifications and combinations of the embodiments are within the scope of the present invention. In the accompanying drawings, various aspects of the present invention are illustrated to more clearly show the chip-scale packaging structures and methods for their formation. Common elements of the illustrated embodiments are designated with like reference numerals. The drawings are not meant to be illustrative of actual views of any particular portion of a chip-scale packaging structure, but are merely idealized schematic representations which are employed to more clearly and fully depict the invention in connection with the following description.

Figure 1:
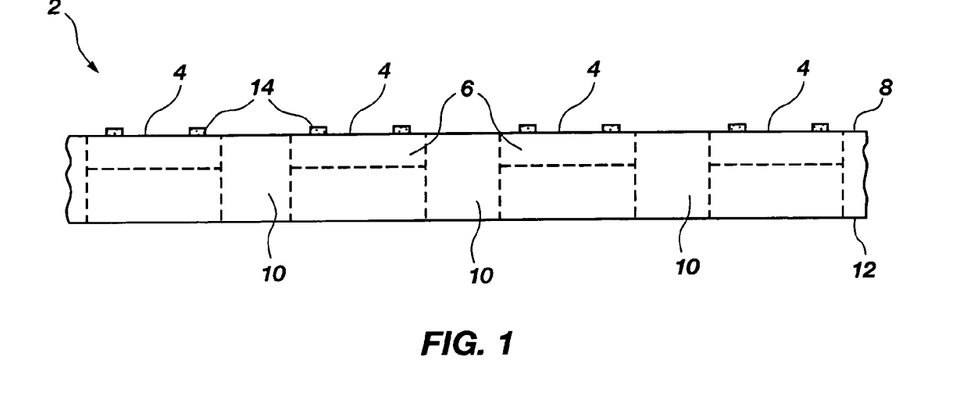
FIG. 1 is a side view of a semiconductor wafer containing an array of semiconductor die locations.

Illustrated in drawing FIG. 1 is a semiconductor wafer 2 containing an array of semiconductor die locations 4 formed thereon using known fabrication techniques. Typically, the array of semiconductor die locations 4 is created as circuit layers 6 on and/or extending into one side of wafer 2, forming an active surface 8 of the wafer 2. FIG. 1 shows that adjacent semiconductor die locations 4 are separated by streets 10 of semiconductor material providing areas for subsequently separating or "singulating" semiconductor die locations 4 into individual or discrete semiconductor dice 104 (FIG. 2), as will be described in further detail below. The opposite or back side of wafer 2 remains free of circuitry leaving a passive surface 12 comprised of the semiconductor material of wafer 2. In this manner, many semiconductor devices may be formed and processed from wafer 2 at the same time.

Bond pads 14 are also formed on active surface 8 to provide external electrical contacts for the circuitry of each semiconductor die location 4. As described above, bond pads 14 may be electrically connected to higher-level circuitry on a carrier substrate using various techniques, including flip-chip mounting, TAB, or conventional wire bonding. While not depicted in FIG. 1, bond pads 14 may include one or more layers of metallic material comprising an under-bump metallization (UBM). UBM is known in the art and is used to improve adhesion of tin/lead solder material of conductive bumps formed on bond pads 14 for flip-chip or TAB connection. Furthermore, although not depicted in FIG. 1, a known bond pad rerouting structure, often referred to as a redistribution layer (RDL), may be formed on active surface 8 to relocate connection points for the bond pads 14. This may be required when bond pads 14 are not configured in a suitable pattern for attachment to a given carrier substrate or are too closely spaced, or pitched, to allow formation of conductive bumps. Accordingly, as used herein, the term "bond pads" encompasses bond pads formed directly on active surface 8 of wafer 2, as well as exposed UBM or RDL surfaces which are configured for use as the external connection points of semiconductor die locations 4.

Figure 2:
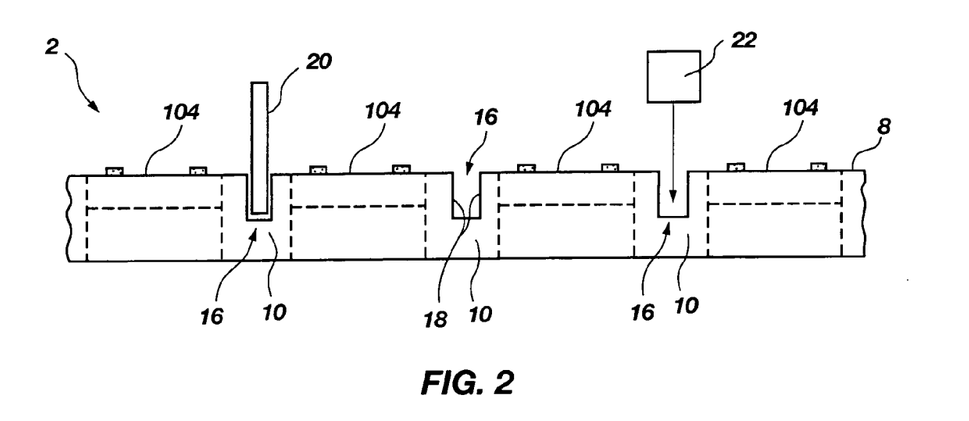
FIG. 2 is a side view of the wafer in FIG. 1 with channels cut in the active surface of the wafer between adjacent semiconductor die locations.

Turning to FIG. 2, in a first embodiment of the present invention, channels 16 are formed in active surface 8 of wafer 2 to partially expose side surfaces 18 of semiconductor dice 104. Channels 16 are initially formed along streets 10 between adjacent semiconductor die locations 4 (FIG. 1) by cutting with a dicing saw 20 or a laser beam 22 to a depth extending below circuit layers 6.

Figure 3A:
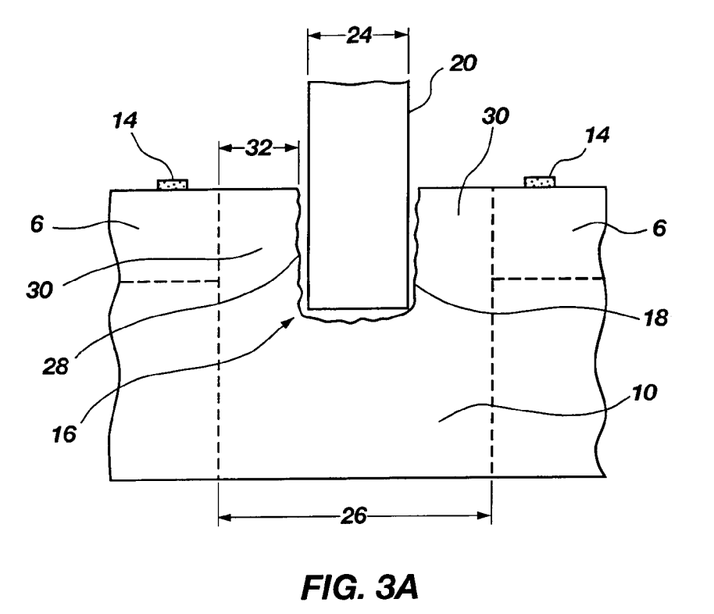
FIG. 3A is an enlarged view of a channel cut with a dicing saw.

FIG. 3A shows an enlarged view of a channel 16 cut with dicing saw 20. When separating semiconductor die locations 4 into individual semiconductor dice 104, it is necessary to cut channel 16 with a dicing saw 20 having a width 24 that is smaller than the width 26 of streets 10. As a result, a layer of semiconductor material remains uncut along the sides of channel 16 so circuit layers 6 are not exposed through side surfaces 18, which may otherwise increase the possibility of circuit damage during cutting or later processing operations. Furthermore, diamond particles in dicing saw 20 may leave scratches 28 in the side surfaces 18 of semiconductor dice 104. Scratches 28 introduce undesirable stress concentrations in side surfaces 18 that promote crack propagation in the semiconductor material. As previously discussed with respect to the present invention, scratches 28 are subsequently removed by an etching process. Therefore, dicing saw 20 is selected to have a width 24 wherein the combined saw-cutting and etching processes leave a sufficiently wide layer of undamaged semiconductor material between circuit layers 6 and side surfaces 18. When cutting a wafer 2 having narrow street widths on the order of 100 microns, for example, the width 24 of dicing saw 20 may be about 40 microns. This leaves an initial layer of semiconductor material 30 on each side of channel 16 having a width 32 of about 30 microns between a periphery of circuit layers 6 and a side surface 18.

Figure 3B:
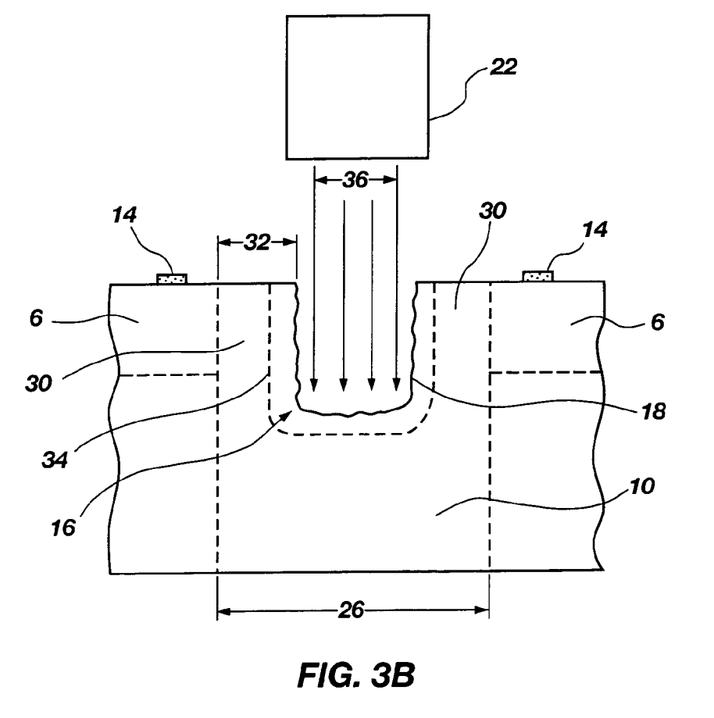
FIG. 3B is an enlarged view of a channel cut with a laser beam.

FIG. 3B shows an enlarged view of a channel 16 cut with laser beam 22. When channel 16 is cut in this manner, heat from laser beam 22 may negatively affect the semiconductor material along side surfaces 18, leaving a heat-affected zone (HAZ) 34. As with the above-described sawing process of the present invention, HAZ 34 is subsequently removed by an etching process. Therefore, laser beam 22 is selected to have a cutting width 36 wherein the combined laser-cutting and etching processes leave a layer of semiconductor material between circuit layers 6 and side surfaces 18. When cutting street widths on the order of 100 microns, for example, the cutting width 36 of laser beam 22 may be about 25 microns. This leaves an initial layer of semiconductor material 30 on both sides of channel 16 having a width 32 of close to 40 microns between circuit layers 6 and side surfaces 18. The specific widths described for dicing saw 20 and laser beam 22 are only exemplary, and may be provided with other widths depending on the amount of semiconductor material 30 that must be left on the sides of channel 16 to enable removal of material defects by subsequent etching.

Figure 4:
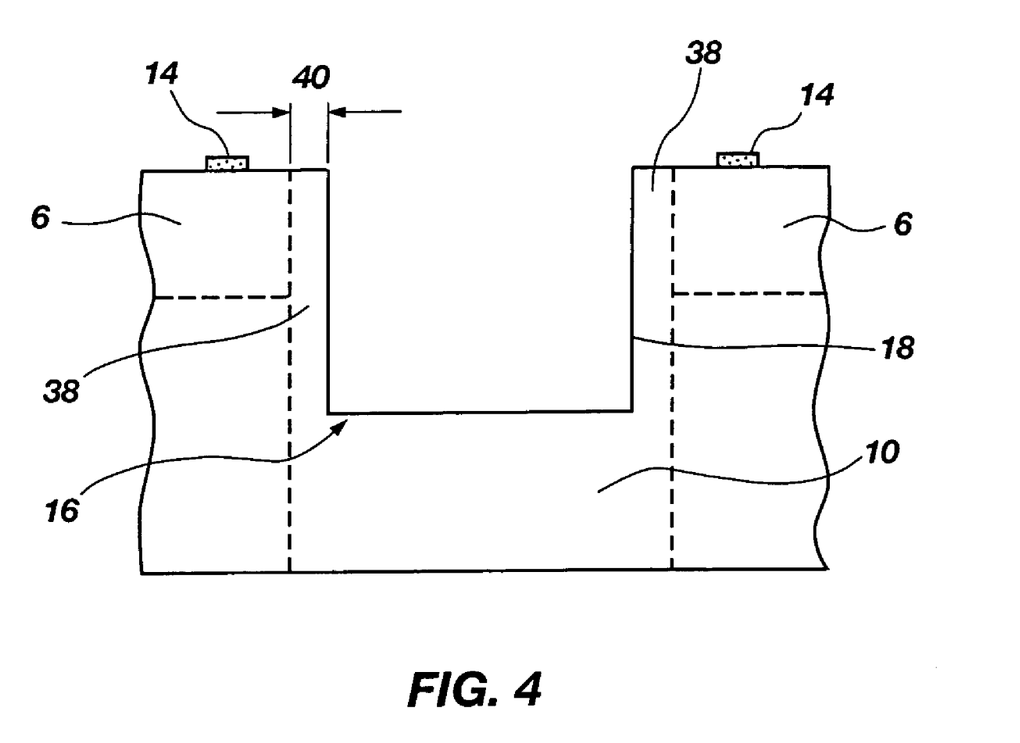
FIG. 4 is an enlarged view of a channel after it has been etched to remove cutting defects.

FIG. 4 shows that side surfaces 18 are etched back to remove the cutting defects while leaving a smooth, undamaged layer of semiconductor material 38 in place adjacent to circuit layers 6. For the 100-micron streets described above, the remaining smooth layer of semiconductor material 38 may have a width 40, for example, of about 5 microns between circuit layers 6 and side surfaces 18. Any known process for etching semiconductor material may be used, such as by applying an anisotropic wet etch solution of aqueous tetramethylammonium hydroxide (TMAH) or potassium hydroxide (KOH) to side surfaces 18. When etching narrow street widths of about 100 microns, it is currently preferable to use such an anisotropic etching process, which selectively etches specific crystallographic orientations, to prevent etching past the desired remaining layer of semiconductor material adjacent to circuit layers 6.

Figure 5:
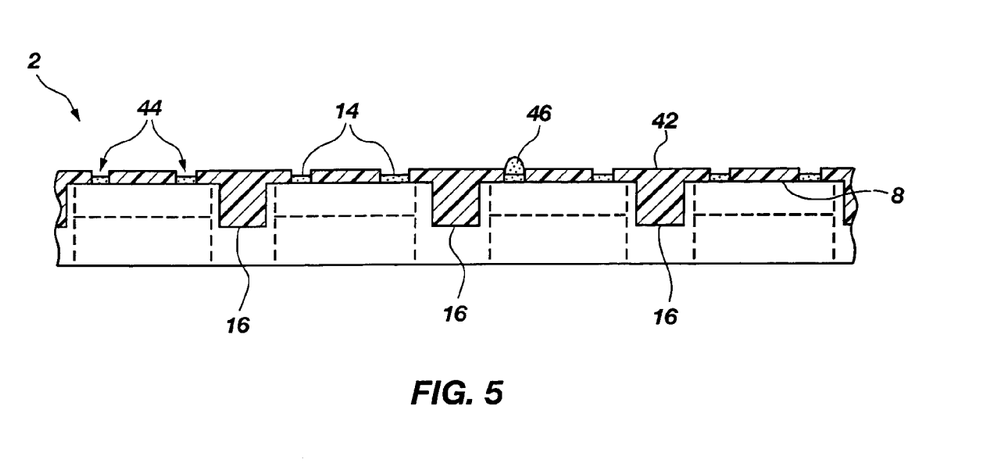
FIG. 5 is a side view of the wafer in FIG. 1 with a protective coating formed on the active surface of the wafer.

After channels 16 have been cut and etched, FIG. 5 shows that a protective coating 42 is formed on wafer 2 to cover active surface 8 and fill channels 16. Protective coating 42 may comprise a liquid polymer sealant material that is sprayed, spin coated or otherwise dispensed onto wafer 2 and then hardened by thermal or ambient temperature curing. One liquid polymer sealant material suitable for protective coating 42 is commercially available from 3D Systems, Inc. of Valencia, Calif., under the product name Accura©SI 40. FIG. 5 shows that protective coating 42 is formed with apertures 44 exposing bond pads 14 in order to allow subsequent electrical connection. In order to form apertures 44, the entire active surface 8 of wafer 2 may be covered, with apertures 44 being formed by subsequent removal of portions of protective coating 42, such as by masking and etching protective coating 42.

It is also possible that protective coating 42 may be formed on wafer 2 using a known stereolithographic process. In stereolithography, protective coating 42 may be formed by curing superimposed layers of a photocurable liquid polymer over active surface 8 by exposure to a source of electromagnetic radiation. Under this process, the photopolymer over bond pads 14 may be left uncured, thereby forming apertures 44 in protective coating 42. Examples of stereolithographic processes suitable for forming protective coating 42 are described in U.S. Pat. No. 6,432,752 to Farnworth and U.S. Pat. No. 6,326,698 to Akram, the disclosures of which are incorporated herein by reference.

As previously discussed, conductive bumps 46 may sometimes be formed on bond pads 14 when electrical connection is accomplished by a flip-chip or TAB-type connection. FIG. 5 shows such a conductive bump 46 formed on a bond pad 14 for purposes of illustration. While the present invention has been described in terms of forming protective coating 42 on wafer 2 prior to the addition of conductive bumps 46, it is also possible that protective coating 42 may be formed with conductive bumps 46 already in place. Stereolithographic formation of protective coating 42 would be especially suitable for this alternative, because any liquid photopolymer on or over conductive bumps 46 could be left uncured to leave them exposed. Of course, protective coating 42 may, as where bond pads 14 are to be exposed, also be a conventional polymer sealant applied by a dispensing process, with portions of protective coating 42 being subsequently removed to expose conductive bumps 46.

Figure 6:
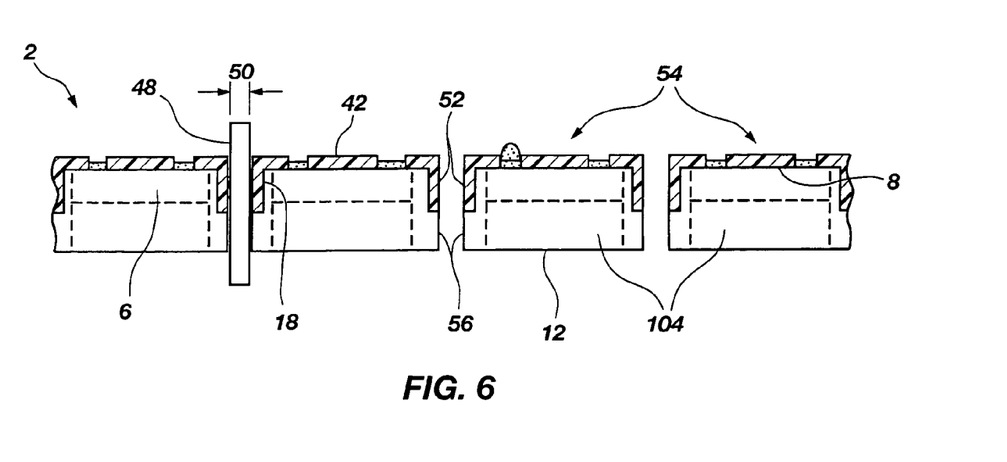
FIG. 6 is a side view of the wafer in FIG. 5 separated into individual chip-scale packages.

FIG. 6 shows that once protective coating 42 is formed on active surface 8, wafer 2 is cut along channels 16 to completely separate individual semiconductor dice 104. Cutting may be accomplished with a dicing saw 48 having a width 50 that is narrower than channels 16. With a wafer 2 having the above-described 100-micron streets, for example, dicing saw 48 may be about 40 microns wide. Side surfaces 18 are thus left covered with a layer 52 of protective coating 42 that is approximately equal to the amount of semiconductor material removed by the etching process. The present embodiment results in chip-scale packages 54, each comprised of an individual semiconductor die 104 with protective coating 42 covering active surface 8 and side surfaces 18. The remaining side surfaces 56 and passive surface 12 of a semiconductor die 104, which are remote from circuit layers 6, may be left exposed.

In some instances, however, it may be necessary or desirable to completely seal semiconductor dice 104, such as when intended for use in extreme environments or when circuit layers 6 are highly sensitive to moisture. In a variation of the above-described embodiment, wafer 2 may be further processed prior to singulation in order to completely seal the individual semiconductor dice 104.

Figure 7:
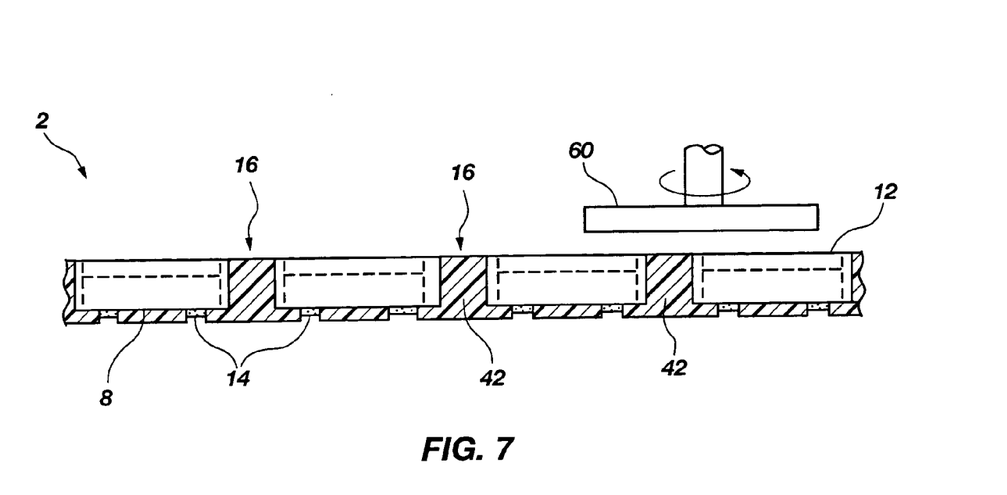
FIG. 7 is a side view of the wafer in FIG. 5 wherein semiconductor material is removed from the passive surface of the wafer by backgrinding.

Turning to FIG. 7, in this alternative, after protective coating 42 is formed on active surface 8, wafer 2 is subjected to a backgrinding or other planarization process prior to being completely separated. This removes excess semiconductor material from passive surface 12 of wafer 2 to reduce the thickness of wafer 2 to a desired overall thickness. Several types of processes are available to perform the thinning of the wafer 2. Either a mechanical grinding process or an abrasive planarization process such as chemical-mechanical planarization (CMP) may be used to remove material from passive surface 12 of wafer 2. For example, in FIG. 7, a grinding wheel 60 may be applied to passive or back side surface 12 of wafer 2 to abrade material therefrom. Alternatively, passive surface 12 of wafer 2 may be chemically etched to remove material. The particular mechanism for thinning wafer 2 is considered to be a matter of convenience to those of ordinary skill in the semiconductor process manufacturing area. As seen in FIG. 7, semiconductor material is removed from passive surface 12 to a depth sufficient to expose protective coating 42 contained in channels 16.

Figure 8:
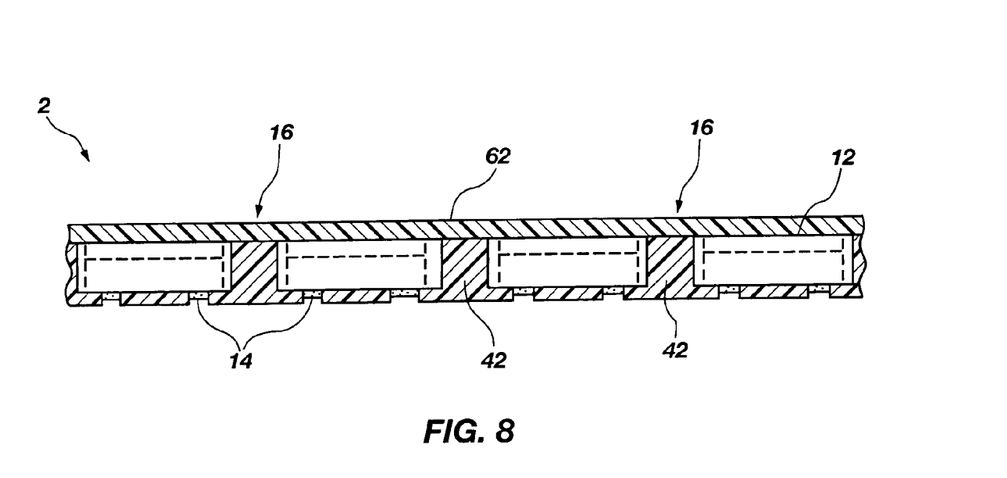
FIG. 8 is a side view of the wafer in FIG. 7 with a protective coating formed on the passive surface of the wafer.
Figure 9:
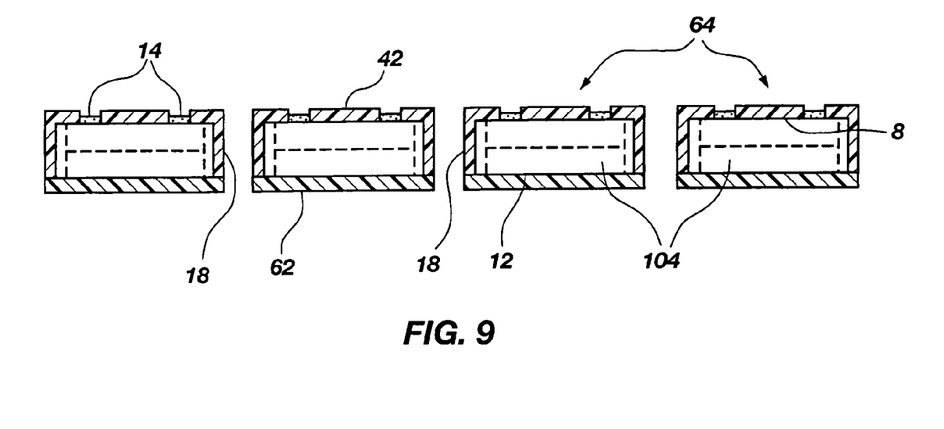
FIG. 9 is a side view of the wafer in FIG. 8 separated into individual chip-scale packages.

In FIG. 8, a second protective coating 62 is formed over passive surface 12. Protective coating 62 may be formed of the same polymer material and by one of the same deposition or stereolithography processes as described above with respect to protective coating 42. Wafer 2 is then cut along channels 16 to completely separate individual semiconductor dice 104. FIG. 9 shows that this variation of the first embodiment results in chip-scale packages 64, each comprised of an individual semiconductor die 104 with protective coating 42 covering active surface 8 and side surfaces 18, and second protective coating 62 covering passive surface 12 of each individual semiconductor die 104. In other words, individual semiconductor dice 104 are substantially completely sealed from the outside environment.

Figure 10:
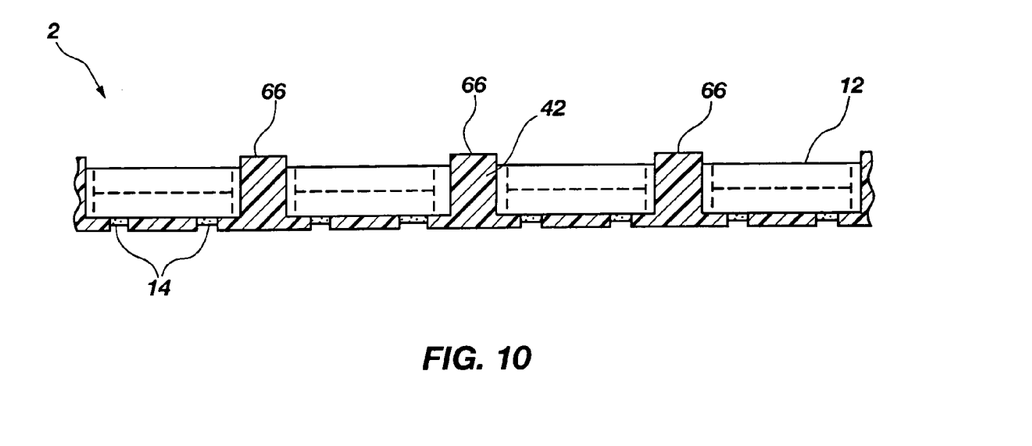
FIG. 10 is a side view of the wafer in FIG. 5, wherein frame elements of the protective coating project from the passive surface of the wafer.
Figure 11:
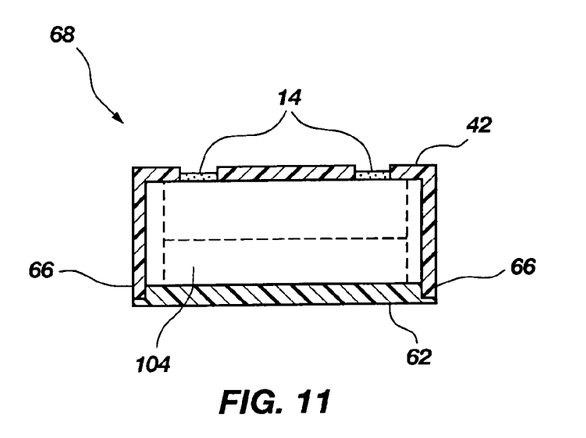
FIG. 11 is a side view of a chip-scale package.

FIG. 10 shows a further variation of the first embodiment of the present invention. After exposing channels 16 by backgrinding or planarization, passive surface 12 of wafer 2 is etched to a depth such that a portion of protective coating 42 protrudes from passive surface 12 to form frame elements 66. Any known process for etching semiconductor material may be used, as long as it selectively etches the semiconductor material of wafer 2 and leaves protective coating 42 in place, such as by using a TMAH etching solution with an additional constituent which reduces or eliminates etching of protective coating 42. Second protective coating 62 is then formed as in FIG. 8, and wafer 2 is cut along channels 16 to completely separate individual semiconductor dice 104. FIG. 11 shows that this further variation to the first embodiment provides a chip-scale package 68 wherein frame elements 66 assist in anchoring second protective coating 62 in place, thereby improving the sealing of semiconductor dice 104.

With either of the above-described variations to the first embodiment of the present invention, it is noted that exposing protective coating 42 within channels 16 through passive surface 12 also provides a mechanism for back side alignment of wafer 2 in subsequent processing. Conventionally, back side alignment of a wafer has been difficult because the pattern of semiconductor dice 104 along streets 10 is not visible on passive surface 12. By exposing protective coating 42 through passive surface 12 in the present invention, the locations of semiconductor dice 104 may be easily viewed for alignment, such by an automated vision system having cameras that enable precision alignment using pattern recognition.

Figure 12:
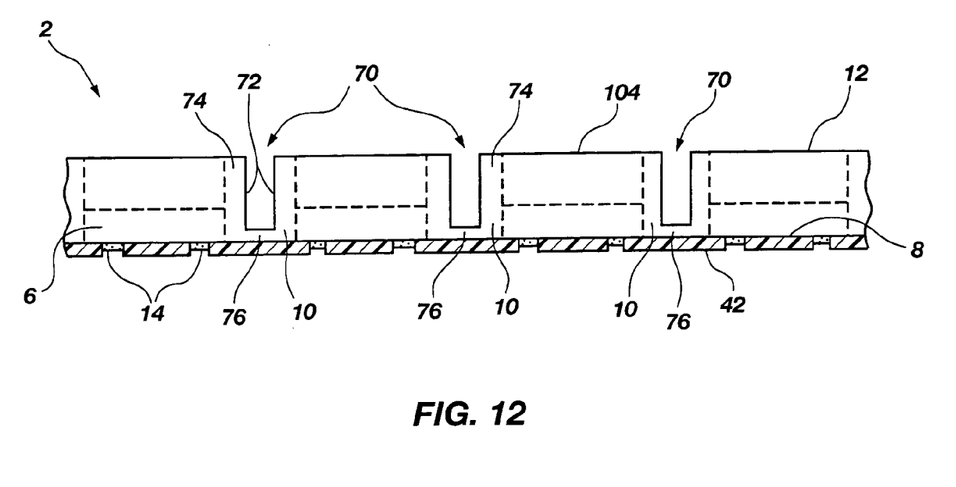
FIG. 12 is a side view of the wafer in FIG. 1 with channels cut in the passive surface of the wafer between adjacent semiconductor die locations.

In a second embodiment according to the present invention shown in FIG. 12, protective coating 42 is deposited on active surface 8 of wafer 2 without prior formation of channels 16 in active surface 8. Instead, channels 70 are formed in the passive surface 12 of wafer 2 after depositing protective coating 42 on active surface 8. As with the first embodiment, channels 70 are initially formed along streets 10 between adjacent semiconductor die locations 4 (FIG. 1) by cutting with a dicing saw 20 or laser beam 22 to expose side surfaces 72 of semiconductor dice 104. FIG. 12 shows that channels 70 are similarly cut to a width such that an initial layer of semiconductor material 74 is left on both sides of channels 70. In the second embodiment, channels 70 are cut to extend almost completely through wafer 2, leaving only a small base portion 76 of wafer semiconductor material connecting adjacent semiconductor dice 104.

Figure 13:
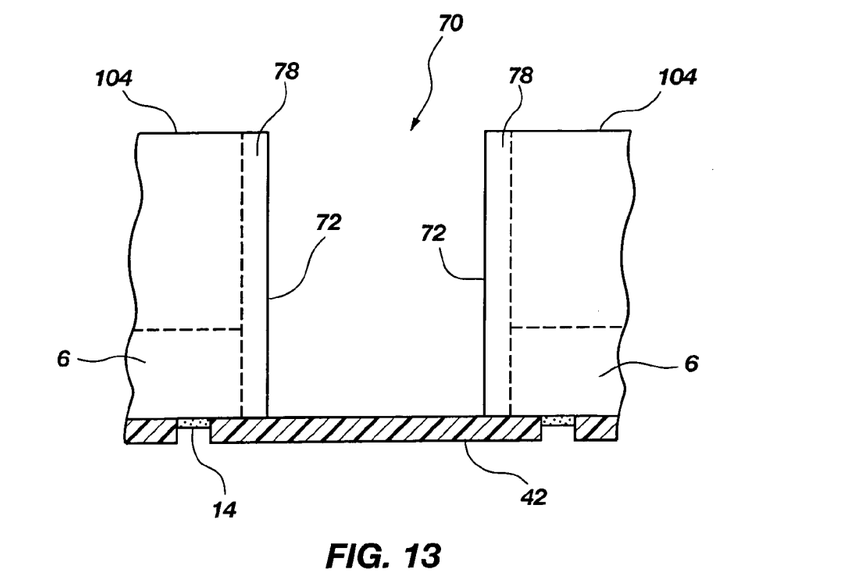
FIG. 13 is an enlarged view of a channel after it has been etched to remove cutting defects.

Once the saw-cutting or laser-cutting process is complete, an etching process is carried out to remove the cutting-induced material defects in side surfaces 72 such as the scratches 28 or HAZ 34 described with respect to the first embodiment. As in the first embodiment, FIG. 13 shows that side surfaces 72 are etched to a point leaving a smooth layer of semiconductor material 78 in place adjacent to circuit layers 6. FIG. 13 shows that the base portion 76 of semiconductor material is etched through to completely separate semiconductor dice 104 and expose protective coating 42 within channel 70.

In the second embodiment of the present invention, a backgrinding or planarization process may also be carried out on passive surface 12 of wafer 2. While removing semiconductor material from passive surface 12 is not required to expose protective coating 42 as in the first embodiment, it may be desirable for other reasons. Reducing the thickness of wafer 2, for example, minimizes the final die size and reduces the time and expense associated with cutting wafer 2 during subsequent singulation into individual chip-scale packages. Furthermore, backgrinding or planarization may remove undesirable contaminants which may have been introduced into passive surface 12 of the wafer 2 during fabrication. With the second embodiment, removal of semiconductor material from passive surface 12 by a backgrinding or planarization process may be carried out prior to cutting channels 70. Alternatively, the etching process itself can be carried out in such a way that the etching solution is applied to remove material from passive surface 12 at the same time side surfaces 72 and base portion 76 are etched within channels 70.

Figure 14:
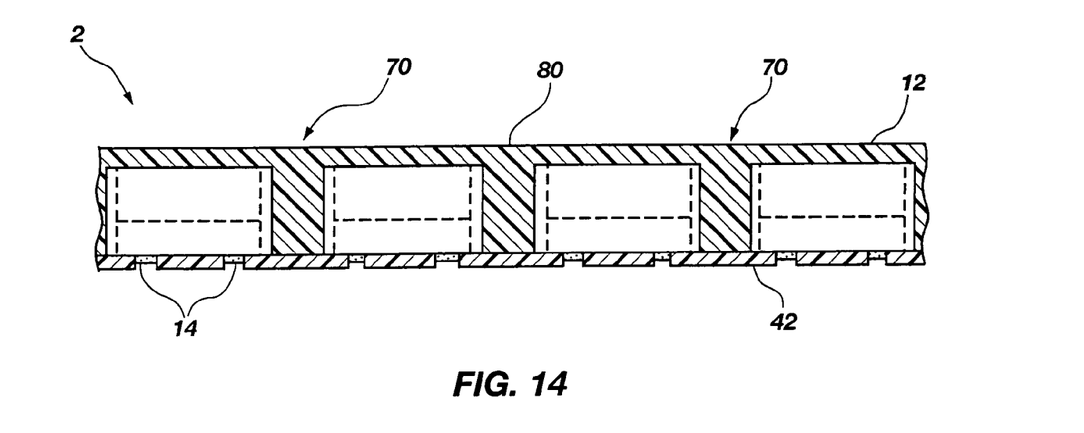
FIG. 14 is a side view of the wafer in FIG. 12 with a protective coating formed on the passive surface of the wafer.
Figure 15:
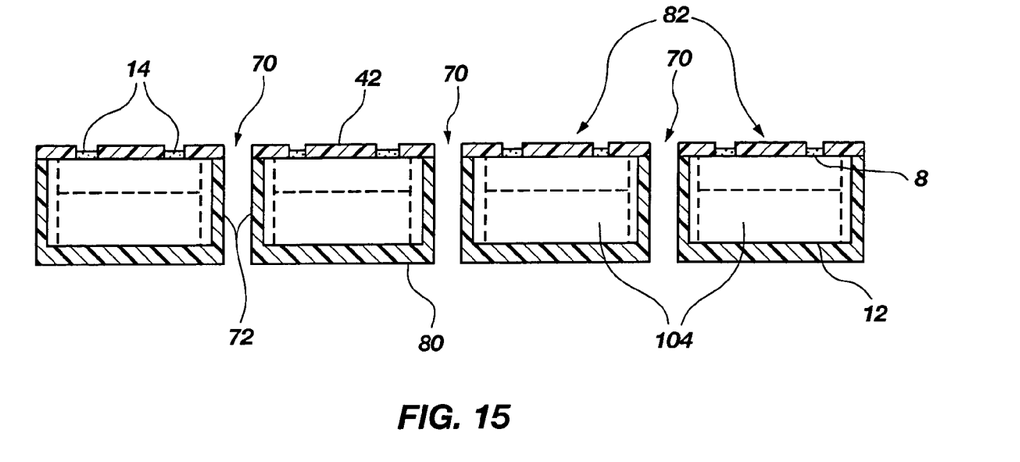
FIG. 15 is a side view of the wafer in FIG. 14 separated into individual chip-scale packages.

FIG. 14 shows that after channels 70 are cut and etched, and any desired removal of semiconductor material from passive surface 12 has been carried out, a second protective coating 80 is formed on wafer 2 to cover passive surface 12 and fill channels 70. Once again, second protective coating 80 may be formed of the same polymer material and by the same deposition or stereolithography processes as described above with respect to protective coating 42. Wafer 2 is then cut along channels 70 for separation into individual chip-scale packages 82, as seen in FIG. 15. FIG. 15 shows that the second embodiment chip-scale packages 82 are each comprised of an individual semiconductor die 104 with protective coating 42 covering active surface 8, and second protective coating 80 covering side surfaces 72 and passive surface 12.

All of the above-illustrated embodiments and variations thereof of the present invention provide chip-scale packaging for semiconductor dice with simplified and reduced sealing processes carried out at the wafer level. Furthermore, the side surfaces of the separated semiconductor dice include a substantially smooth layer of semiconductor material that is substantially free of the defects associated with prior art processes. Although the present invention has been depicted and described with respect to the illustrated embodiments, various additions, deletions and modifications are contemplated within its scope. The scope of the invention is, therefore, indicated by the appended claims rather than the foregoing description. Further, all changes which may fall within the meaning and range of equivalency of the claims and elements and features thereof are to be embraced within their scope.

What is claimed is:

1. A method of forming chip-scale packages, comprising:
    providing a semiconductor wafer having an active surface with a plurality of semiconductor die locations separated by at least one street of semiconductor material and having a passive surface opposite the active surface;
    cutting at least one channel in the active surface of the semiconductor wafer along the at least one street of semiconductor material to expose a plurality of semiconductor die side surface;
    etching the plurality of semiconductor die side surfaces to remove a layer of semiconductor material containing cutting-induced defects;
    forming a first protective coating on the semiconductor wafer to cover the active surface and fill the at least one channel;
    removing a layer of semiconductor material from the passive surface of the semiconductor wafer to a depth sufficient to expose the first protective coating within the at least one channel;
    etching the passive surface of the semiconductor wafer such that the first protective coating exposed within the at least one channel forms at least one frame element protruding from the passive surface of the semiconductor wafer;
    forming a second protective coating on the semiconductor wafer to cover the passive surface; such that the second protective coating is anchored to the passive surface of the semiconductor wafer with the at least one frame element; and
    separating the semiconductor wafer along the at least one channel to form a plurality of individual chip-scale packages.

2. The method of claim 1, wherein cutting the at least one channel in the active surface of the semiconductor wafer comprises cutting the at least one channel with one of a dicing saw and a laser beam.

3. The method of claim 1, wherein forming the first protective coating on the semiconductor wafer comprises:
    applying a liquid polymer material over the active surface of the semiconductor wafer; and
    at least partially curing the liquid polymer material.

4. The method of claim 3, wherein applying the liquid polymer material comprises one of spraying or spin coating the liquid polymer material onto the active surface of the semiconductor wafer.

5. The method of claim 4, wherein each semiconductor die location of the plurality includes at least one bond pad, and further comprising:
    etching a portion of the first protective coating to expose the at least one bond pad of each semiconductor die location.

6. The method of claim 3, wherein the liquid polymer material comprises a photocurable liquid polymer material, and further comprising:
    exposing the photocurable liquid polymer material to a source of electromagnetic radiation to at least partially cure a portion of the photocurable liquid polymer material.

7. The method of claim 6, wherein each semiconductor die location of the plurality includes at least one bond pad, and further comprising:
    selectively curing the photocurable liquid polymer material to leave the at least one bond pad of each semiconductor die location exposed through the first protective coating.

8. The method of claim 1, wherein each semiconductor die location of the plurality includes at least one bond pad, and further comprising:
    forming a conductive bump on the at least one bond pad of each semiconductor die location.

9. The method of claim 8, wherein forming the conductive bump on the at least one bond pad comprises forming the conductive bump prior to forming the first protective coating on the semiconductor wafer.

10. The method of claim 9, wherein forming the first protective coating comprises:
    spraying or spin coating a liquid polymer material onto the active surface of the semiconductor wafer; and
    at least partially curing the liquid polymer material.

11. The method of claim 10, further comprising:
    etching a portion of the first protective coating to expose the conductive bump on the at least one bond pad of each semiconductor die location.

12. The method of claim 9, wherein forming the first protective coating comprises:
    applying a photocurable liquid polymer material over the active surface of the semiconductor wafer; and
    exposing the photocurable liquid polymer material to a source of electromagnetic radiation to at least partially cure a portion of the photocurable liquid polymer material.

13. The method of claim 12, further comprising:
    selectively curing the photocurable liquid polymer material to leave the conductive bump on the at least one bond pad of each semiconductor die location exposed through the first protective coating.

14. The method of claim 1, wherein removing the layer of semiconductor material comprises planarizing the passive surface of the semiconductor wafer with at least one of a mechanical process and a chemical process.

15. The method of claim 14, wherein removing the layer of semiconductor material comprises backgrinding the passive surface of the semiconductor wafer.

16. The method of claim 14, wherein removing the layer of semiconductor material comprises a CMP process.

17. The method of claim 1, wherein each semiconductor die location of the plurality of semiconductor die locations comprises a plurality of circuit layers extending a depth into the semiconductor wafer from the active surface of the semiconductor wafer, and wherein cutting the at least one channel in the active surface of the semiconductor wafer comprises cutting the at least one channel to a depth that is greater than the depth of the circuit layers within the semiconductor wafer.

18. The method of claim 1, wherein etching the plurality of semiconductor die side surfaces comprises etching the plurality of semiconductor die side surfaces with an anisotropic etching process.

19. A method of forming chip-scale packages, comprising:
providing a semiconductor wafer having an active surface with a plurality of semiconductor die locations separated by at least one street of semiconductor material;
forming a first protective coating on the semiconductor wafer to cover the active surface;
cutting at least one channel in a passive surface of the semiconductor wafer along the at least one street of semiconductor material to expose a plurality of semiconductor die side surfaces;
etching the plurality of semiconductor die side surfaces to remove a layer of semiconductor material containing cutting-induced defects and to expose the first protective coating within the at least one channel;
forming a second protective coating on the semiconductor wafer to cover the passive surface and fill the at least one channel; and
separating the semiconductor wafer along the at least one channel to form a plurality of individual chip-scale packages.

20. The method of claim 19, wherein cutting the at least one channel in the passive surface of the semiconductor wafer comprises cutting the at least one channel with one of a dicing saw and a laser beam.

21. The method of claim 19, wherein forming the first protective coating on the semiconductor wafer comprises:
applying a liquid polymer material over the active surface of the semiconductor wafer; and
at least partially curing the liquid polymer material.

22. The method of claim 21, wherein applying the liquid polymer material comprises one of spraying or spin coating the liquid polymer material onto the active surface of the semiconductor wafer.

23. The method of claim 22, wherein each semiconductor die location of the plurality includes at least one bond pad, and further comprising:
etching a portion of the first protective coating to expose the at least one bond pad of each semiconductor die location.

24. The method of claim 21, wherein the liquid polymer material comprises a photocurable liquid polymer material, and further comprising:
exposing the photocurable liquid polymer material to a source of electromagnetic radiation to at least partially cure a portion of the photocurable liquid polymer material.

25. The method of claim 24, wherein each semiconductor die location of the plurality includes at least one bond pad, and further comprising:
selectively curing the photocurable liquid polymer material to leave the at least one bond pad of each semiconductor die location exposed through the first protective coating.

26. The method of claim 19, wherein each semiconductor die location of the plurality includes at least one bond pad, and further comprising:
forming a conductive bump on the at least one bond pad.

27. The method of claim 26, wherein forming the conductive bump on the at least one bond pad comprises forming the conductive bump prior to forming the first protective coating on the semiconductor wafer.

28. The method of claim 27, wherein forming the first protective coating comprises:
spraying or spin coating a liquid polymer material onto the active surface of the semiconductor wafer; and
at least partially curing the liquid polymer material.

29. The method of claim 28, further comprising:
etching a portion of the first protective coating to expose the conductive bump on the at least one bond pad of each semiconductor die location.

30. The method of claim 27, wherein forming the first protective coating comprises:
applying a photocurable liquid polymer material over the active surface of the semiconductor wafer; and
exposing the photocurable liquid polymer material to a source of electromagnetic radiation to at least partially cure a portion of the photocurable liquid polymer material.

31. The method of claim 30, further comprising:
selectively curing the photocurable liquid polymer material to leave the conductive bump on the at least one bond pad of each semiconductor die location exposed through the first protective coating.

32. The method of claim 19, further comprising:
removing a layer of semiconductor material from the passive surface of the semiconductor wafer prior to forming the second protective coating on the semiconductor wafer.

33. The method of claim 32, wherein removing the layer of semiconductor material comprises planarizing the passive surface of the semiconductor wafer with at least one of a mechanical process and a chemical process.

34. The method of claim 33, wherein removing the layer of semiconductor material comprises backgrinding the passive surface of the semiconductor wafer.

35. The method of claim 33, wherein removing the layer of semiconductor material comprises a CMP process.

36. The method of claim 21, wherein etching the plurality of semiconductor die side surfaces comprises etching the plurality of semiconductor die side surfaces with an anisotropic etching process.

37. A method of forming chip-scale packages, comprising:
providing a semiconductor wafer having an active surface with a plurality of semiconductor die locations separated by at least one street of semiconductor material;
forming a first protective coating on the semiconductor wafer to cover the active surface;
cutting at least one channel in a passive surface of the semiconductor wafer along the at least one street of semiconductor material to expose a plurality of semiconductor die side surfaces;

etching the plurality of semiconductor die side surfaces to remove a layer of semiconductor material containing cutting-induced defects and to expose the first protective coating within the at least one channel;

planarizing the passive surface of the semiconductor wafer with at least one of a mechanical process and a chemical process to remove a layer of semiconductor material from the passive surface of the semiconductor wafer, wherein planarizing and etching the plurality of semiconductor die side surfaces occur concurrently;

forming a second protective coating on the semiconductor wafer after removing the layer of semiconductor material to cover the passive surface and fill the at least one channel; and separating the semiconductor wafer along the at least one channel to form a plurality of individual chip-scale packages.

38. The method of claim 37, wherein cutting the at least one channel in the passive surface of the semiconductor wafer comprises cutting the at least one channel with one of a dicing saw and a laser beam.

39. The method of claim 37, wherein forming the first protective coating on the semiconductor wafer comprises:

applying a liquid polymer material over the active surface of the semiconductor wafer; and at least partially curing the liquid polymer material.

40. The method of claim 39, wherein applying the liquid polymer material comprises one of spraying or spin coating the liquid polymer material onto the active surface of the semiconductor wafer.

41. The method of claim 40, wherein each semiconductor die location of the plurality includes at least one bond pad, and further comprising:

etching a portion of the first protective coating to expose the at least one bond pad of each semiconductor die location.

42. The method of claim 39, wherein the liquid polymer material comprises a photocurable liquid polymer material, and further comprising:

exposing the photocurable liquid polymer material to a source of electromagnetic radiation to at least partially cure a portion of the photocurable liquid polymer material.

43. The method of claim 42, wherein each semiconductor die location of the plurality includes at least one bond pad, and further comprising:

selectively curing the photocurable liquid polymer material to leave the at least one bond pad of each semiconductor die location exposed through the first protective coating.

44. The method of claim 37, wherein each semiconductor die location of the plurality includes at least one bond pad, and further comprising:

forming a conductive bump on the at least one bond pad.

45. The method of claim 44, wherein forming the conductive bump on the at least one bond pad comprises forming the conductive bump prior to forming the first protective coating on the semiconductor wafer.

46. The method of claim 45, wherein forming the first protective coating comprises:

spraying or spin coating a liquid polymer material onto the active surface of the semiconductor wafer; and at least partially curing the liquid polymer material.

47. The method of claim 46, further comprising:

etching a portion of the first protective coating to expose the conductive bump on the at least one bond pad of each semiconductor die location.

48. The method of claim 45, wherein forming the first protective coating comprises:

applying a photocurable liquid polymer material over the active surface of the semiconductor wafer; and exposing the photocurable liquid polymer material to a source of electromagnetic radiation to at least partially cure a portion of the photocurable liquid polymer material.

49. The method of claim 48, further comprising:

selectively curing the photocurable liquid polymer material to leave the conductive bump on the at least one bond pad of each semiconductor die location exposed through the first protective coating.

50. The method of claim 37, wherein etching the plurality of semiconductor die side surfaces comprises etching the plurality of semiconductor die side surfaces with an anisotropic etching process.

* * * * *